(12) United States Patent  
Xie et al.

(10) Patent No.: US 9,190,486 B2  
(45) Date of Patent: Nov. 17, 2015

(54) INTEGRATED CIRCUITS AND METHODS FOR FABRICATING INTEGRATED CIRCUITS WITH REDUCED PARASITIC CAPACITANCE

(71) Applicant: GLOBALFOUNDRIES, Inc., Grand Cayman (KY)

(72) Inventors: Ruilong Xie, Albany, NY (US); Xiuyu Cai, Albany, NY (US); Xunyuan Zhang, Albany, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 119 days.

(21) Appl. No.: 13/682,331

(22) Filed: Nov. 20, 2012

(65) Prior Publication Data

US 2014/0138779 A1 May 22, 2014

(51) Int. Cl.
| | |
|---|---|
| H01L 21/76 | (2006.01) |
| H01L 29/66 | (2006.01) |
| H01L 29/40 | (2006.01) |
| H01L 29/49 | (2006.01) |
| H01L 29/78 | (2006.01) |

(52) U.S. Cl.
CPC ........ *H01L 29/66545* (2013.01); *H01L 29/401* (2013.01); *H01L 29/4991* (2013.01); *H01L 29/66553* (2013.01); *H01L 29/66628* (2013.01); *H01L 29/78* (2013.01)

(58) Field of Classification Search
USPC ......... 438/197, 299, 595, 257, 300, 303, 421, 438/422, 619, 700, 738; 257/E21.409, 257/E29.255, E21.19
See application file for complete search history.

(56) References Cited

U.S. PATENT DOCUMENTS

| | | | |
|---|---|---|---|
| 6,303,418 B1 * | 10/2001 | Cha et al. | 438/199 |
| 6,914,318 B2 * | 7/2005 | Lee et al. | 257/522 |
| 7,585,716 B2 | 9/2009 | Cheng | |
| 7,691,712 B2 * | 4/2010 | Chidambarrao et al. | 438/275 |
| 7,704,851 B2 * | 4/2010 | Kim | 438/422 |
| 2002/0163036 A1 * | 11/2002 | Miura et al. | 257/336 |
| 2012/0088359 A1 * | 4/2012 | Kim et al. | 438/589 |

* cited by examiner

*Primary Examiner* — Meiya Li  
*Assistant Examiner* — Peter M Albrecht  
(74) *Attorney, Agent, or Firm* — Ingrassia Fisher & Lorenz, P.C.

(57) ABSTRACT

Integrated circuits and methods for fabricating integrated circuits are provided. In an embodiment, a method for fabricating an integrated circuit includes forming a sacrificial gate structure over a semiconductor substrate. A spacer is formed around the sacrificial gate structure and a dielectric material is deposited over the spacer and semiconductor substrate. The method includes selectively etching the spacer to form a trench between the sacrificial gate structure and the dielectric material. The trench is bounded by a trench surface upon which a replacement spacer material is deposited. The method merges an upper region of the replacement spacer material to enclose a void within the replacement spacer material.

20 Claims, 4 Drawing Sheets

INTEGRATED CIRCUITS AND METHODS FOR FABRICATING INTEGRATED CIRCUITS WITH REDUCED PARASITIC CAPACITANCE

TECHNICAL FIELD

The present disclosure generally relates to integrated circuits and methods for fabricating integrated circuits, and more particularly relates to integrated circuits and methods for fabricating integrated circuits with reduced parasitic capacitance.

BACKGROUND

Parasitic capacitance of a field effect transistor reduces the performance of the transistor by reducing the switching speed. Specifically, the capacitive coupling of a gate electrode to adjacent circuit components limits the rate at which the voltage of the gate electrode may be changed. The delay in the changes in the gate voltage due to the capacitive coupling with adjacent circuit components is then reflected in an increase in a turn-on time and a turn-off time of the field effect transistor.

All transistors with a gate electrode, including metal oxide semiconductor field effect transistors (MOSFETs), are prone to this type of parasitic capacitive coupling to adjacent circuit components by design. Particularly, highly scaled MOSFETs, in which contact vias to the source and drain regions are located close to the gate electrode, suffer from high parasitic capacitance between the gate electrode and the contact vias due to their physical proximity.

A gate stack including a high-k gate dielectric (a gate dielectric having a dielectric constant of more than 4.0, and typically more than 7.0) and a metal gate is a promising structure for continuing scaling of complementary metal oxide semiconductors (CMOS). A replacement gate process can be used to form such high-k metal gates. In a replacement gate process, a sacrificial gate electrode is formed first and is then replaced with a gate stack including a high-k gate dielectric and a metal gate. As a result of this process, the high-k gate dielectric is present along the sidewalls of the metal gate. The high value of the dielectric constant of the high-k gate dielectric affects parasitic capacitance adversely since the parasitic capacitance is proportional to the dielectric constant of the material between the gate electrode and the contact vias. Thus, it is desirable to incorporate a lower-k value spacer adjacent to the high-k gate dielectric spacer for highly scaled replacement gate CMOS. However, even conventional low-k materials (such SiCN, SiCBN) have k values of at least about 5. Further, such low-k materials suffer from the release of carbon during spacer etch processing or during subsequent source/drain activation annealing.

Accordingly, it is desirable to provide integrated circuits and methods for fabricating integrated circuits with reduced parasitic capacitance. Further, it is desirable to provide integrated circuits and methods for fabricating integrated circuits with high-k metal gates formed by replacement gate processes that provide for self-aligned contacts and reduced parasitic capacitance. Furthermore, other desirable features and characteristics will become apparent from the subsequent detailed description and the appended claims, taken in conjunction with the accompanying drawings and the foregoing technical field and background.

BRIEF SUMMARY

Integrated circuits and methods for fabricating integrated circuits are provided. In accordance with one embodiment, a method for fabricating an integrated circuit includes forming a sacrificial gate structure over a semiconductor substrate. A spacer is formed around the sacrificial gate structure and a dielectric material is deposited over the spacer and semiconductor substrate. The method includes selectively etching the spacer to form a trench between the sacrificial gate structure and the dielectric material. The trench is bounded by a trench surface upon which a replacement spacer material is deposited. The method merges an upper region of the replacement spacer material to enclose a void within the replacement spacer material.

In another embodiment, a method for fabricating an integrated circuit includes forming a sacrificial gate structure over a semiconductor substrate. The method includes depositing a spacer material adjacent the sacrificial gate structure and enclosing a void within the spacer material to form a hollow spacer. In the method, the sacrificial gate structure is removed to form an opening adjacent the hollow spacer. Further, a replacement gate structure is formed in the opening.

In accordance with another embodiment, an integrated circuit includes a semiconductor substrate, and a gate structure formed on the semiconductor substrate. The integrated circuit further includes a hollow spacer formed around the gate structure and enclosing a void. Also, the integrated circuit includes a contact via self-aligned with the hollow spacer.

BRIEF DESCRIPTION OF THE DRAWINGS

Embodiments of methods for fabricating integrated circuits with reduced parasitic capacitance will hereinafter be described in conjunction with the following drawing figures, wherein like numerals denote like elements, and wherein.

DETAILED DESCRIPTION

The following detailed description is merely exemplary in nature and is not intended to limit integrated circuits or the methods for fabricating integrated circuits as claimed herein. Furthermore, there is no intention to be bound by any expressed or implied theory presented in the preceding technical field, background or brief summary, or in the following detailed description.

In accordance with the various embodiments herein, integrated circuits and methods for fabricating integrated circuits with reduced parasitic capacitance are provided. Parasitic capacitance issues faced by conventional processes using high-k metal gates may be avoided. Specifically, it is contemplated herein that a hollow spacer be formed around a sacrificial gate structure before replacement of the sacrificial gate structure with the high-k metal gate structure. The hollow gate includes a void or pocket that typically holds air, which has a dielectric constant, or k value, of about 1. As a result, the hollow spacer has an effective low dielectric constant despite being formed from otherwise non-low-k material. Due to the effective low dielectric constant of the hollow spacer, parasitic capacitance between the high-k metal gate structure and later formed contacts is reduced.

FIGS. 1-12 illustrate steps in accordance with various embodiments of methods for fabricating integrated circuits. Various steps in the design and composition of integrated circuits are well known and so, in the interest of brevity, many conventional steps will only be mentioned briefly herein or will be omitted entirely without providing the well known process details. Further, it is noted that integrated circuits include a varying number of components and that single components shown in the illustrations may be representative of multiple components.

Figure 1:
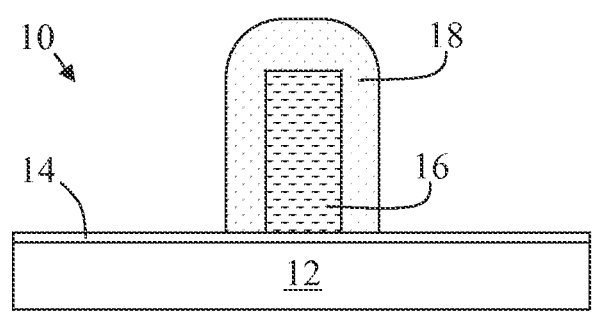
FIGS. 1-12 illustrate, in cross section, a portion of an integrated circuit and method steps for fabricating an integrated circuit in accordance with various embodiments herein.

In FIG. 1, in an exemplary embodiment, the method for fabricating an integrated circuit 10 begins by providing a semiconductor substrate 12. The semiconductor substrate can be a planar substrate or three dimensional substrate like a FINFET. A gate oxide layer 14 is deposited over the semiconductor substrate. Further, a sacrificial gate material, such as polysilicon, is deposited over the gate oxide layer 14 and is selectively masked and etched to form a sacrificial gate 16 with a hard mask overlying the gate 16. Then a spacer material, such as silicon nitride, is deposited around the hard mask and over the gate oxide layer 14 and is etched to form sacrificial spacer 18. In FIG. 1, the hard mask is incorporated into the sacrificial spacer 18.

Figure 2:
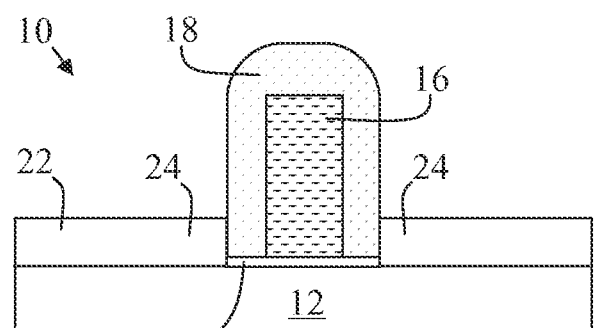

FIG. 2 illustrates the integrated circuit 10 after the gate oxide layer 14 has been etched from areas not covered by the sacrificial gate 16 or sacrificial spacer 18. Also, epitaxial region 22 has been optionally grown on the exposed semiconductor substrate 12. The epitaxial region 22 can be doped or undoped Si, SiGe, SiC, etc. Further, source/drain regions 24 have been formed in the epitaxial region 22 and/or semiconductor substrate 12 by implants performed with the sacrificial spacer 18 acting as a mask.

Figure 3:
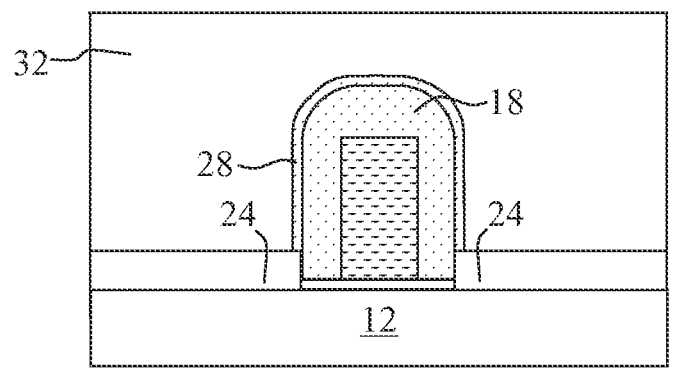

FIG. 3 illustrates the deposition of a liner material 28, such as silicon nitride, over the source/drain regions 24 and the sacrificial spacer 18. Also, a dielectric material 32, such as flowable oxide is deposited overlying the liner material 28 to a height above the sacrificial spacer 18.

Figure 4:
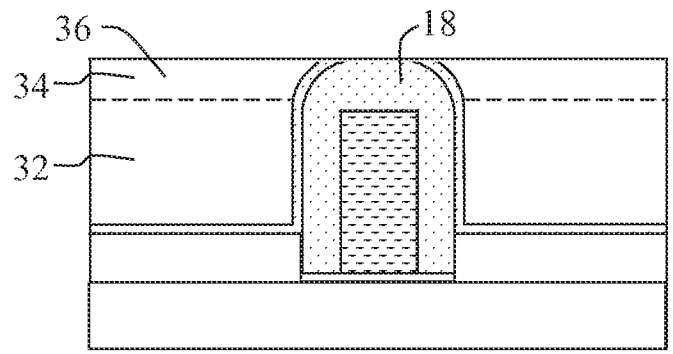

As shown in FIG. 4, a planarization process, such as chemical mechanical planarization (CMP) has been performed to remove the dielectric material 32 above the sacrificial spacer 18. An optional etch process may be performed to selectively remove an additional portion 34 of the dielectric material 32. If the optional etch process is performed, another dielectric material 36, such as silicon oxide, may be deposited over the dielectric material 32 and then planarized to the height of the sacrificial spacer 18 as shown in FIG. 4. In an exemplary embodiment, the dielectric material 36 is oxide deposited by high density plasma (HDP) deposition.

Figure 5:
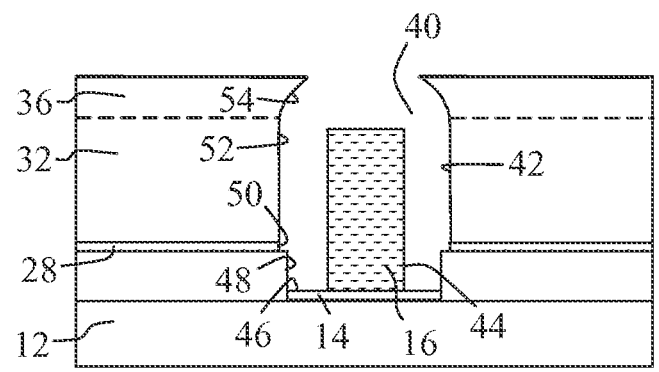

In FIG. 5, a selective etch process is performed to remove at least a portion of the sacrificial spacer 18. In an exemplary embodiment, the process is a reactive ion etch that is highly selective to removing silicon nitride. As shown, the removal of the sacrificial spacer 18 creates a trench 40 defined by a trench surface 42. More specifically, the trench surface 42 is formed by a surface 44 of the sacrificial gate 16, a surface 46 of the gate oxide layer 14, a surface 48 of the semiconductor substrate 12, a surface 50 of the liner material 28, a surface 52 of the dielectric material 32, and in certain embodiments, a surface 54 of the dielectric material 36. It should be noted that the etching process can, but does not necessarily, etch away all spacer 18. Some remaining spacer 18 can still exist at bottom portion of the trench above the surface 46 of the gate oxide as well.

Figure 6:
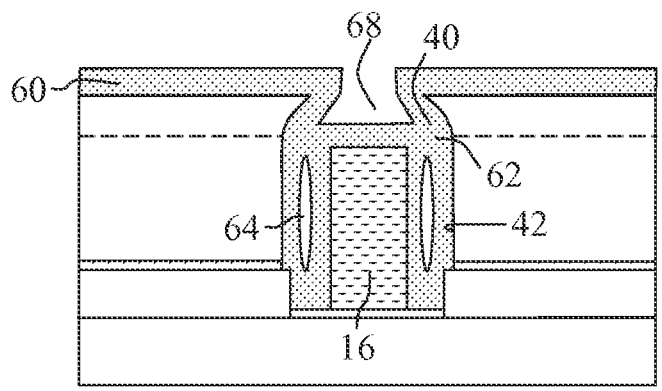

In FIG. 6, a replacement spacer material 60, such as silicon nitride, SiCN, or SiCBN, is deposited on the trench surface 42 and over the top of the integrated circuit 10. An exemplary replacement spacer material 60 has a dielectric constant of about 7 or no more than about 7, such as about 5, or lower. For example, silicon carbide-boron nitride (SiCBN) may be used. The replacement spacer material 60 is conformally deposited and merges at an upper portion 62 within the trench 40. As a result, the replacement spacer material 60 defines a void 64 and a pocket 68. The void 64 may hold an ambient gas such as air. As shown, the void 64 is formed around the sacrificial gate 16. As a result, the void 64 lowers the effective dielectric constant of the replacement spacer material 60 (assuming the replacement spacer material 60 has a dielectric constant higher than that of air). In an exemplary embodiment, the replacement spacer material 60 is deposited by atomic layer deposition (ALD).

Figure 7:
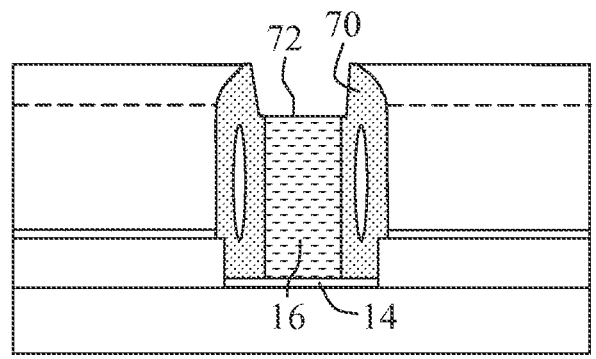
Figure 8:
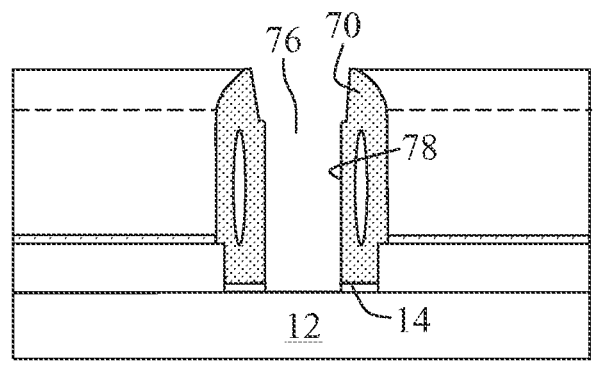

In FIG. 7, a portion of the replacement spacer material is removed by anisotropic etch to define a replacement spacer 70, or hollow spacer, and to expose a top surface 72 of the sacrificial gate 16. Then, as shown in FIG. 8, the sacrificial gate 16 and underlying gate oxide layer 14 are removed, such as by hot ammonia and wet HF etch. The replacement spacer 70 is not removed during this etch process. Removal of the sacrificial gate 16 and underlying gate oxide layer 14 results in the formation of an opening 76 between the portions of the replacement spacer 70. As shown, the opening 76 is bounded by an opening surface 78 that is formed by the replacement spacer 70, the gate oxide layer 14, and the semiconductor substrate 12.

Figure 9:
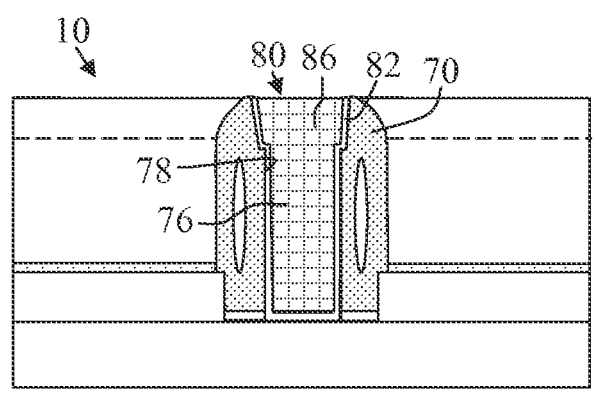

In FIG. 9, a replacement gate structure 80, such as a high-k metal gate structure, is formed in the opening 76. Specifically, a high-k dielectric material 82 is deposited on the opening surface 78. In an exemplary embodiment, the high-k dielectric material 82 is conformally deposited, such as by ALD. Then, the high-k dielectric material 82 is annealed. Thereafter, a metal layer 86 or a combination of metal layers is deposited over the high-k dielectric material 82 and planarized as shown. FIG. 9 illustrates the final structure of the replacement gate structure 80 and replacement spacer 70. Further processing is performed to provide selected electrical connection for the integrated circuit 10.

Figure 10:
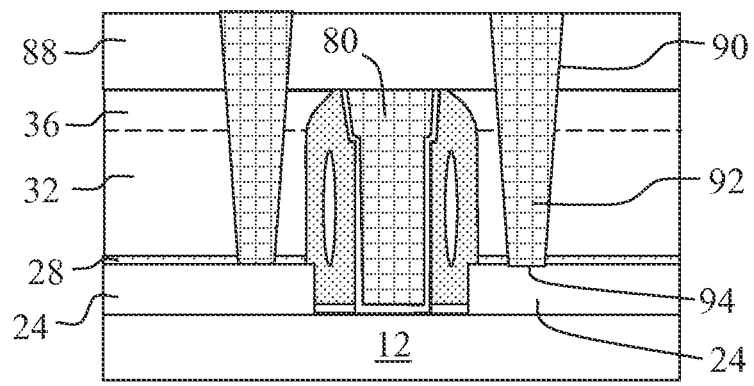

Referring now to FIG. 10, an exemplary embodiment for providing electrical connection to the source/drain regions 24 is illustrated. As shown, an interlayer dielectric 88 is deposited over the dielectric material 32 or 36 and over the replacement gate structure 80. Then, trenches 90 are formed through the interlayer dielectric 88, dielectric material 36 and 32, and liner material 28 to the semiconductor substrate 12 at the source/drain regions 24. As shown, the trenches 90 are filled with a conductive metal to form conductive vias 92 with contacts 94 to the source/drain regions 24. In the exemplary embodiment, the trenches 90 do not contact or expose the replacement spacer 70 and a portion of the dielectric material 32 and 36 remains between the conductive vias 92 and the replacement spacer 70.

Figure 11:
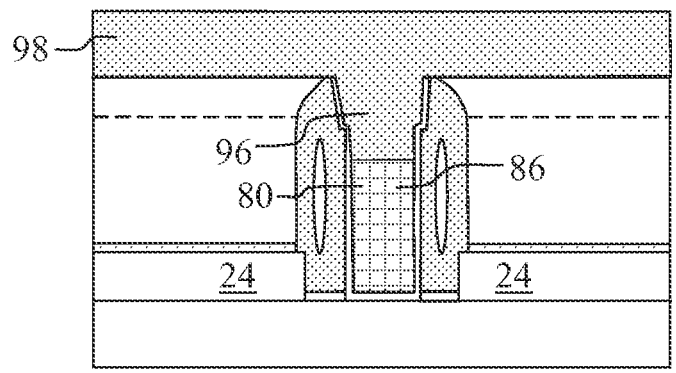
Figure 12:
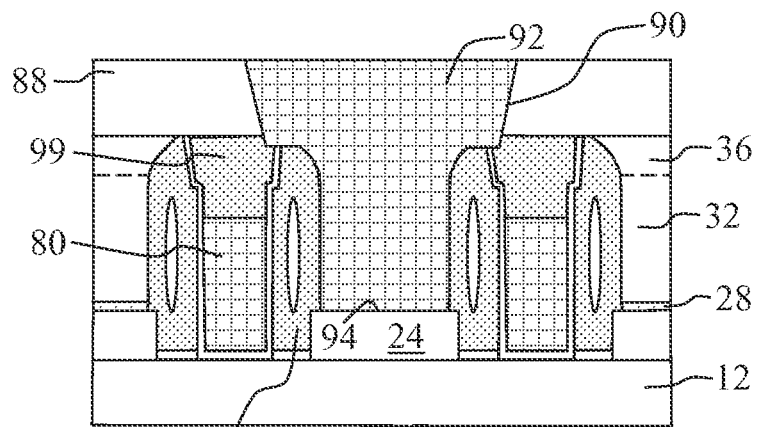

FIGS. 11 and 12 illustrate another exemplary embodiment in which the conductive vias 92 are self-aligned with the source/drain regions 24. In FIG. 11, the self-aligning contact process begins by recessing a portion of the replacement gate structure 80. Specifically, a portion of the metal layer 86 is etched to form a gate recess 96 over the remaining metal layer 86. Note that the high-k dielectric could be optionally recessed back as well. Then a capping material 98, typically a dielectric such as silicon nitride, is deposited in the gate recess 96 and over the rest of the integrated circuit 10.

In FIG. 12, which depicts two neighboring replacement gate structures 80, the capping material is planarized to form a gate cap 99 over each replacement gate structure 80. Then, the interlayer dielectric 88 is deposited over each gate cap 99 and over the dielectric material 32 or 36. Trenches 90 are formed through the interlayer dielectric 88, dielectric material 36 and 32, and liner material 28 to the semiconductor substrate 12 at the source/drain region 24 between neighboring replacement gate structures 80. As shown, the trenches 90 are filled with a conductive metal to form conductive vias 92 with contacts 94 to the source/drain regions 24. In the embodiment of FIGS. 11 and 12, the trenches 90 contact each replacement spacer 70. As a result, each conductive via 92 is self-aligned with the respective source/drain region 24, forming self-aligned contacts 94.

The integrated circuits and fabrication methods described herein result in reduced parasitic capacitance for high-k metal replacement gate structures positioned near contacts to source/drain regions. Specifically, hollow spacers are formed with voids or pockets that hold ambient gas, such as air. The low dielectric constant of the ambient gas in the void reduces the effective dielectric constant of the hollow spacers. As a result, spacers formed with conventional material, such as silicon nitride, having a dielectric constant of about 7 are provided with a sufficiently low effective dielectric constant to reduce or eliminate parasitic capacitance between the high-k metal gate replacement gate structures. Hollow replacement spacers formed from material having lower dielectric constants, such as silicon carbide-boron nitride (SiCBN), for example, which has a dielectric constant of about 5, exhibit even lower effective dielectric constants when provided with a void of ambient gas. The hollow low-k spacer won't suffer extensive etching or high temperature annealing process compared to conventional spacer formed earlier, thus the carbon can easily retain inside the film. Further, the fabrication methods described herein are easily incorporated into existing fabrication processes and are compatible with self-aligned contact formation.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit, comprising:
    forming a sacrificial gate structure over a semiconductor substrate,
        wherein a top surface of the sacrificial gate structure is located a first distance from the semiconductor substrate;
    forming a spacer around the sacrificial gate structure;
    depositing a dielectric material over the spacer and the semiconductor substrate;
    selectively etching the spacer to form a trench between the sacrificial gate structure and the dielectric material, wherein the trench is bounded by a trench surface, wherein a top end of the trench surface is located a second distance from the semiconductor substrate, and wherein the second distance is greater than the first distance; and
    depositing a replacement spacer material along the trench surface and merging an upper region of the replacement spacer material to form a merged upper region of the replacement spacer material, to enclose a void within the replacement spacer material and to partially enclose a pocket within the replacement spacer material, wherein the void is formed around at least one sidewall of the sacrificial gate structure, the pocket is formed directly over and overlaps the sacrificial gate structure, and the pocket does not overlap the void.

2. The method of claim 1, further comprising:
    etching a portion of the merged upper region of the replacement spacer material and exposing the sacrificial gate structure;
    removing the sacrificial gate structure to form an opening adjacent the replacement spacer material; and
    forming a replacement gate structure in the opening, wherein a top surface of the replacement gate structure is located a third distance from the semiconductor substrate, and wherein the third distance is greater than the first distance.

3. The method of claim 1, further comprising:
    depositing a liner over the spacer and over the semiconductor substrate to define a spacer portion of the liner and at least one substrate portion of the liner, wherein depositing the dielectric material over the spacer and the semiconductor substrate comprises depositing the dielectric material over the liner.

4. The method of claim 3, wherein selectively etching the spacer to form the trench comprises selectively etching the spacer and the spacer portion of the liner to form the trench, and wherein the at least one substrate portion of the liner remains underlying the dielectric material.

5. The method of claim 2, further comprising:
    recessing an upper portion of the replacement gate structure to form a recess;
    depositing a gate cap material in the recess; and
    forming a self-aligned contact adjacent the replacement spacer material.

6. The method of claim 3, wherein depositing the liner to define the at least one substrate portion of the liner comprises depositing the liner to define a first substrate portion of the liner and a second substrate portion of the liner, and wherein depositing the replacement spacer material to enclose the void within the replacement spacer material comprises enclosing the void directly between the first substrate portion of the liner and the second substrate portion of the liner.

7. The method of claim 1, wherein selectively etching the spacer to form the trench comprises partially etching the spacer.

8. The method of claim 1, further comprising:
    etching a portion of the merged upper region of the replacement spacer material to form an upper trench exposing the sacrificial gate structure, wherein the upper trench is defined by sidewalls formed by an unetched portion of the merged upper region of the replacement spacer material;
    removing the sacrificial gate structure to form an opening adjacent the replacement spacer material; and
    forming a replacement gate structure in the opening and in the upper trench.

9. A method for fabricating an integrated circuit, comprising:
    forming a sacrificial gate structure over a semiconductor substrate;
    depositing a spacer material adjacent and over the sacrificial gate structure to enclose a void within the spacer material and to partially enclose a pocket within the spacer material, wherein the void is formed around at least one sidewall of the sacrificial gate structure, the pocket is formed directly over and overlaps the sacrificial gate structure, and the pocket does not overlap the void, and wherein depositing the spacer material adjacent the sacrificial gate structure to enclose the void within the spacer material comprises forming a hollow spacer;

etching the spacer material over the sacrificial gate structure to form an upper trench bounded by the sacrificial gate structure and an unetched portion of the spacer material;

removing the sacrificial gate structure to form an opening adjacent the hollow spacer; and forming a replacement gate structure in the opening.

10. The method of claim 9, further comprising:

defining a lower trench adjacent the sacrificial gate structure, wherein the lower trench is bounded by a trench surface of the lower trench, wherein a top surface of the sacrificial gate structure is located a first distance from the semiconductor substrate, wherein a top end of the trench surface of the lower trench is located a second distance from the semiconductor substrate, wherein the second distance is greater than the first distance, and wherein depositing the spacer material adjacent the sacrificial gate structure comprises depositing the spacer material in the lower trench.

11. The method of claim 9, further comprising:

depositing a gate dielectric layer over the semiconductor substrate, wherein forming the sacrificial gate structure comprises forming the sacrificial gate structure over the gate dielectric layer, and wherein depositing the spacer material comprises depositing the spacer material over the gate dielectric layer and enclosing the void directly over the gate dielectric layer.

12. The method of claim 10, further comprising:

depositing a gate dielectric layer on the semiconductor substrate, wherein forming the sacrificial gate structure comprises forming the sacrificial gate structure on a gate portion of the gate dielectric layer, wherein depositing the spacer material comprises depositing the spacer material on a spacer portion of the gate dielectric layer, and wherein the void is positioned directly over the spacer portion of the gate dielectric layer.

13. The method of claim 9, wherein forming the sacrificial gate structure comprises forming the sacrificial gate structure with a top surface of the sacrificial gate structure located a first distance from the semiconductor substrate, wherein forming the replacement gate structure comprises forming the replacement gate structure with a top surface of the replacement gate structure located a second distance from the semiconductor substrate, and wherein the second distance is greater than the first distance.

14. The method of claim 9, wherein forming the replacement gate structure in the opening comprises forming the replacement gate structure in the opening and in the upper trench.

15. The method of claim 9, further comprising:

recessing an upper portion of the replacement gate structure to form a recess;

depositing a gate cap material in the recess; and forming a self-aligned contact adjacent the hollow spacer.

16. A method for fabricating an integrated circuit, comprising:

forming a sacrificial gate structure over a semiconductor substrate;

depositing a spacer material adjacent and over the sacrificial gate structure to enclose a void within the spacer material and to partially enclose a pocket within the spacer material, wherein the void is formed around at least one sidewall of the sacrificial gate structure, the pocket is formed directly over and overlaps the sacrificial gate structure, and the pocket does not overlap the void;

removing the sacrificial gate structure to form an opening adjacent the spacer material; and forming a replacement gate structure in the opening.

17. The method of claim 16, further comprising:

selectively etching a portion of the spacer material to form an upper trench before removing the sacrificial gate structure, the portion of the spacer material being disposed over the sacrificial gate structure and partially enclosing the pocket, wherein the upper trench is defined by sidewalls formed by an unetched portion of the spacer material.

18. The method of claim 17, wherein forming the replacement gate structure comprises forming the replacement gate structure in the opening and in the upper trench, wherein the sacrificial gate structure has a first height, and wherein the replacement gate structure has a second height greater than the first height.

19. The method of claim 16, further comprising:

defining a trench adjacent the sacrificial gate structure, wherein the trench is bounded by a trench surface, and wherein the pocket is located inside the trench.

20. The method of claim 16, further comprising:

depositing a dielectric material over the sacrificial gate structure and the semiconductor substrate, wherein a top surface of the dielectric material is positioned above a top surface of the sacrificial gate structure; and defining a trench in the dielectric material and adjacent the sacrificial gate structure, wherein the pocket is located inside the trench, directly above the top surface of the sacrificial gate structure and lower than the top surface of the dielectric material.

* * * * *